United States Patent
Cho et al.

(10) Patent No.: US 7,098,482 B2
(45) Date of Patent: Aug. 29, 2006

(54) MONOLITHIC WHITE LIGHT EMITTING DEVICE

(75) Inventors: Jae-hee Cho, Gyeonggi-do (KR); Suk-ho Yoon, Seoul (KR); Jeong-wook Lee, Gyeonggi-do (KR)

(73) Assignee: Samsung Electro-mechanics Co., Ltd., Suwon-si (KR)

( * ) Notice: Subject to any disclaimer, the term of this patent is extended or adjusted under 35 U.S.C. 154(b) by 0 days.

(21) Appl. No.: 11/071,223

(22) Filed: Mar. 4, 2005

(65) Prior Publication Data
US 2005/0199892 A1      Sep. 15, 2005

(30) Foreign Application Priority Data
Mar. 11, 2004   (KR) .................. 10-2004-0016473

(51) Int. Cl.
*H01L 27/15*     (2006.01)
(52) U.S. Cl. .............. 257/79; 257/86; 257/E33.023
(58) Field of Classification Search ............. 257/74, 257/94, 96, 101–103, E33.025, E33.049, 257/13, 14, 79, 86, E33.023, E33.001, E33.08; 275/E33.023; 438/FOR. 256, FOR. 264, 438/FOR. 267
See application file for complete search history.

(56) References Cited

U.S. PATENT DOCUMENTS

| | | | | |
|---|---|---|---|---|
| 5,684,309 A | * | 11/1997 | McIntosh et al. | 257/191 |
| 5,834,331 A | * | 11/1998 | Razeghi | 438/40 |
| 6,459,100 B1 | * | 10/2002 | Doverspike et al. | 257/97 |

* cited by examiner

*Primary Examiner*—Brook Kebede
(74) *Attorney, Agent, or Firm*—Buchanan Ingersoll & Rooney PC

(57) ABSTRACT

A monolithic white light emitting device is provided. An active layer in the monolithic white light emitting device is doped with silicon or rare earth metal that forms a sub-band. The number of active layers included in the monolithic white light emitting device is one or two. When two active layers are included in the monolithic white light emitting device, a cladding layer is interposed between the two active layers. According to this light emission structure, white light can be emitted by a semiconductor, so a phosphor is not necessary. The monolithic white light emitting device is easily manufactured at a low cost and applied to a wide range of fields compared with a conventional white light emitting device that needs a help of a phosphor.

15 Claims, 4 Drawing Sheets

MONOLITHIC WHITE LIGHT EMITTING DEVICE

BACKGROUND OF THE INVENTION

Priority is claimed to Korean Patent Application No. 10-2004-0016473, filed on Mar. 11, 2004, in the Korean Intellectual Property Office, the disclosure of which is incorporated herein in its entirety by reference.

1. Field of the Invention

The present invention relates to a white light emitting device, and more particularly, to a monolithic white light emitting device capable of spontaneous white light emission.

2. Description of the Related Art

Generally, white light emitting devices generate white light using light emission by a semiconductor and light emission by a phosphor (see U.S. Pat. Nos. 6,069,440 and 5,998,925). These light emitting devices absorb light emitted by the semiconductor using the phosphor, and together the phosphor and semiconductor emit light close to white in color. Specifically, the semiconductor usually emits blue light, and the phosphor absorbs the blue light emitted by the semiconductor to generate green/red light. Hence, the phosphor is a mixture of green and red fluorescent materials.

According to a hybrid white light emitting device having such a structure, it is not easy to implement an integrated circuit manufactured according to an existing semiconductor manufacturing process. Thus, a field to which the hybrid white light emitting device is applied is restricted.

T. Mukai has proposed a white light emitting device (LED) having no phosphors and using multi-band emission (see JJAP 41 (3A) L246 2002). Accordingly, Mukai's LED has a plurality of active layers to generate light of different wavelengths.

This LED, which is usually used in a backlight device, needs to be easily manufactured and to have high light-emission efficiency and whiteness to have wide commercial acceptance.

SUMMARY OF THE INVENTION

The present invention provides a monolithic white light emitting device having a simple structure that can be easily manufactured.

According to an aspect of the present invention, there is provided a white light emitting device comprising an n-type nitride semiconductor layer, a p-type nitride semiconductor layer, and an active layer having a quantum well structure, interposed between the n-type and p-type nitride semiconductor layers. Light emission based on a quantum level and light emission based on a doping level formed by doping atoms simultaneously occur in the active layer.

According to another aspect of the present invention, there is provided a white light emitting device comprising an n-type nitride semiconductor layer, a p-type nitride semiconductor layer, first and second active layers each having a quantum well structure, interposed between the n-type and p-type nitride semiconductor layers, and a nitride cladding layer installed between the first and second active layers. Light emission based on a doping level formed by doping atoms occurs in the first active layer, and light emission based on a quantum level occurs in the second active layer.

The n-type and p-type nitride semiconductor layers may be GaN. Each of the first and second active layers may include a GaN barrier layer and an InGaN well layer. The well layer may be doped with the doping atoms. The doping atoms may be silicon or a rare earth metal, for instance.

The n-type semiconductor layer may be GaN doped with Si, and the p-type semiconductor layer may be GaN doped with Mg.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

A monolithic white light emitting device according to the present invention will now be described in detail with reference to the accompanying drawings, in which exemplary embodiments are shown.

Figure 1:
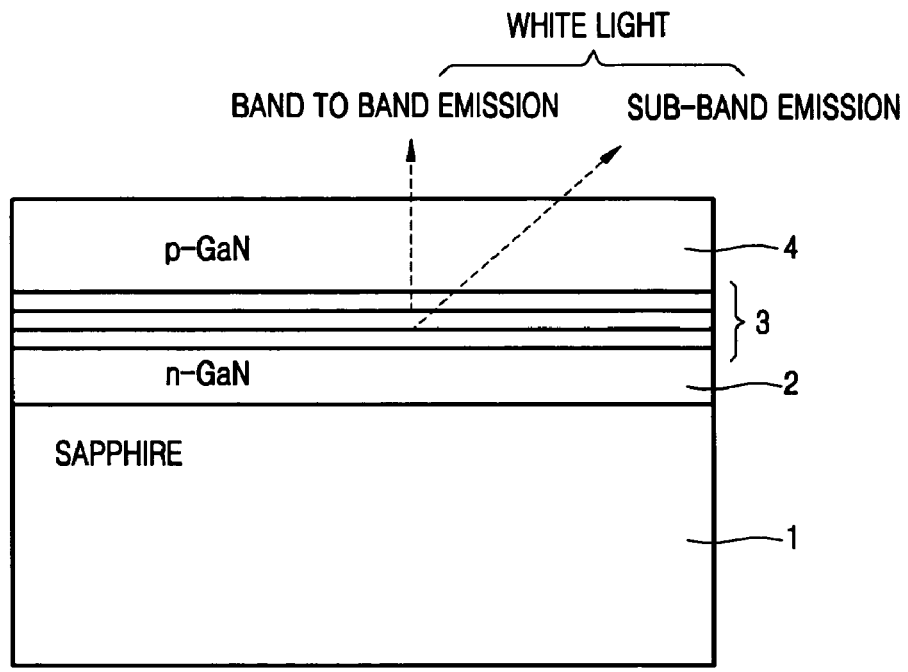
FIG. 1 is a schematic cross-sectional view of a vertical structure of a light emitting device according to a first embodiment of the present invention.
Figure 2:
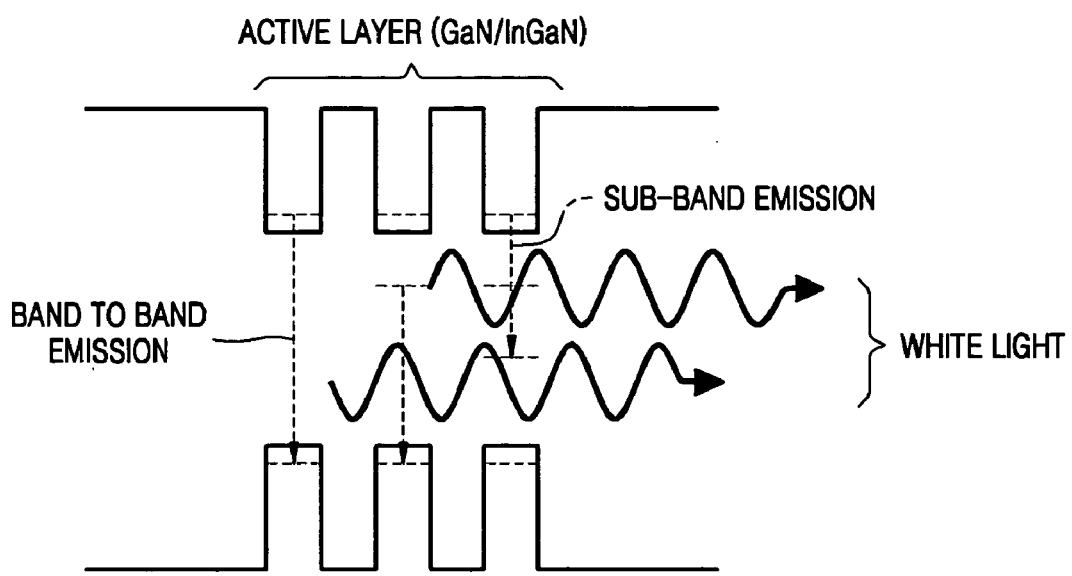
FIG. 2 is an energy distribution diagram explaining a light-emission mechanism of the light emitting device of FIG. 1.

FIG. 1 is a schematic cross-sectional view of a vertical structure of a light emitting device according to a first embodiment of the present invention. FIG. 2 is an energy distribution diagram explaining a light-emission mechanism of the light emitting device of FIG. 1.

Referring to FIG. 1, first, an n-cladding layer (n-GaN) 2, doped with Si, is formed as an n-type semiconductor layer on an insulative substrate 1, which is formed of sapphire, for example. A multi-quantum well (MQW) active layer 3 is formed on the n-cladding layer 2. A p-cladding layer (p-GaN) 4, doped with Mg, is formed as a p-type semiconductor layer on the MQW active layer 3. A barrier layer in the MQW active layer 3 is formed of GaN, and a well layer therein includes AlGaN. Theses layers are stacked, for example, for about 5 periods, to form the MQW active layer 3.

According to an aspect of the present invention, the MQW active layer 3 is doped with silicon or a rare earth metal or metals as impurities. At this time, the impurities may be doped in either the well layer or the barrier layer, preferably, in the well layer. The impurities are doped in the whole or a part of the MQW active layer 3. Hence, as illustrated in FIGS. 1 and 2, both band-to-band emission based on a quantum level and a sub-band emission based on a doping level formed by doping atoms simultaneously occur in the MQW active layer 3, so that white light can be obtained. This white light emission according to the present invention is achieved not by natural defects but by impurity defects due to an implantation of silicon or rare earth metal ions (RE-ion). Tm may be used as the rare earth metal for a central wavelength of 430 to 480 nm. Er, Ho, Tb, or the like may be uses as the rare earth metal for a central wavelength of 520 to 570 nm. Si may be uses as the rare earth metal for a central wavelength of 540 to 590 nm. Eu, Sm, Pr, or the like may be uses as the rare earth metal for a central wavelength of 580 to 630 nm.

Figure 3:
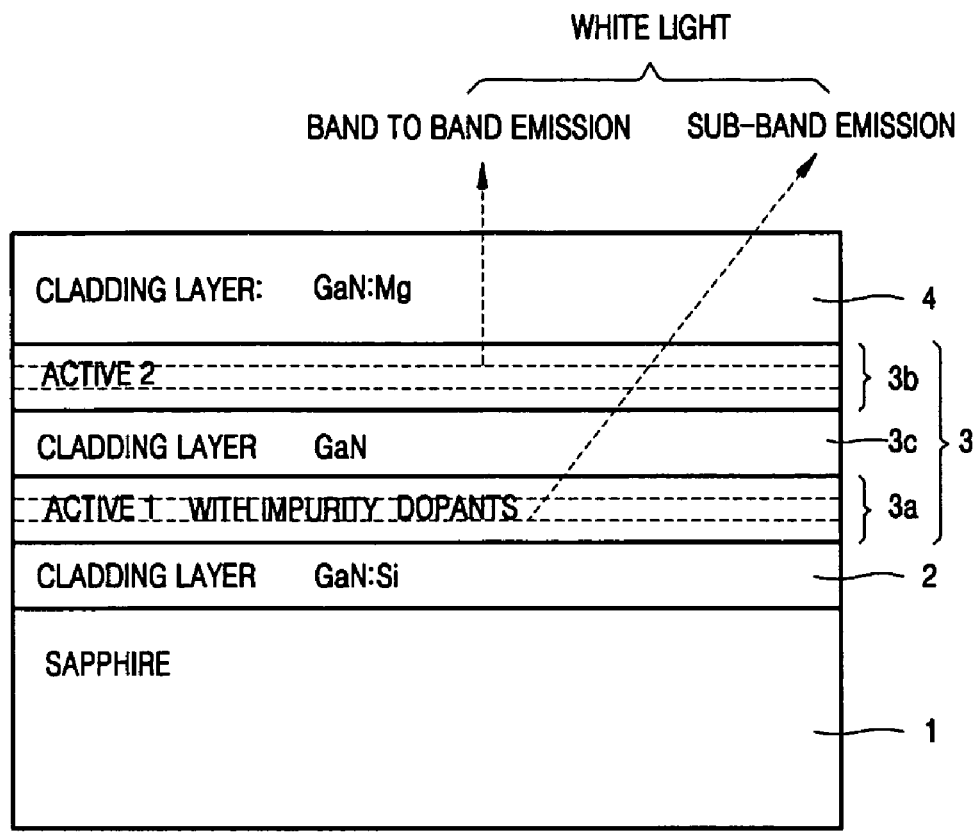
FIG. 3 is a schematic cross-sectional view of a vertical structure of a light emitting device according to a second embodiment of the present invention.
Figure 4:
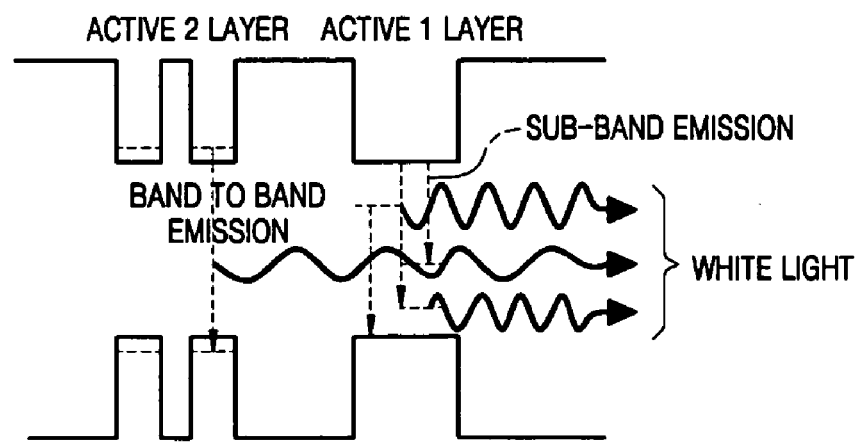
FIG. 4 is an energy distribution diagram explaining a light-emission mechanism of the light emitting device of FIG. 3.

FIG. 3 is a schematic cross-sectional view of a vertical structure of a light emitting device according to a second embodiment of the present invention. FIG. 4 is an energy distribution diagram explaining a light-emission mechanism of the light emitting device of FIG. 3.

In contrast with the first embodiment, an MQW active layer 3 of the light emitting device according to the second embodiment has first and second active layers 3a and 3b, which are separated from each other by a cladding layer 3c.

Referring to FIG. 3, first, an n-cladding layer (n-GaN) 2, doped with Si, is formed as an n-type semiconductor layer on an insulative substrate 1, which is formed of sapphire, for example. The first and second active layers 3a and 3b, each having an MQW structure, which is a feature of the present invention, and having the cladding layer (GaN) 3c therebetween, are formed on the n-cladding layer 2. A p-cladding layer (p-GaN) 4, doped with Mg, is formed as a p-type semiconductor layer on the MQW active layer 3. A barrier layer in the MQW active layer 3 is formed of GaN, and a well layer therein includes AlGaN. Theses layers are stacked, for example, for about 5 periods, to form the MQW active layer 3.

According to an aspect of the present invention, one of the first and second active layers 3a and 3b is doped with impurities and the other has a conventional MQW structure not doped with impurities. In the second embodiment, the first active layer 3a is doped with rare earth metal as impurities, and the second active layer 3b is not doped with impurities, that is, has a conventional MQW structure. At this time, the impurities may be doped in either a well layer or a barrier layer of the first active layer 3a, preferably, in the well layer. More specifically, the impurities are doped in the whole or a part of the first active layer 3a.

The second active layer 3b has a conventional MQW structure.

Hence, as illustrated in FIGS. 3 and 4, band-to-band emission based on a quantum level occurs in the second active layer 3b, having the MQW structure, and a sub-band emission based on a doping level formed by doping atoms occurs in the first active layer 3a, doped with silicon or rare earth metal ions.

Figure 5:
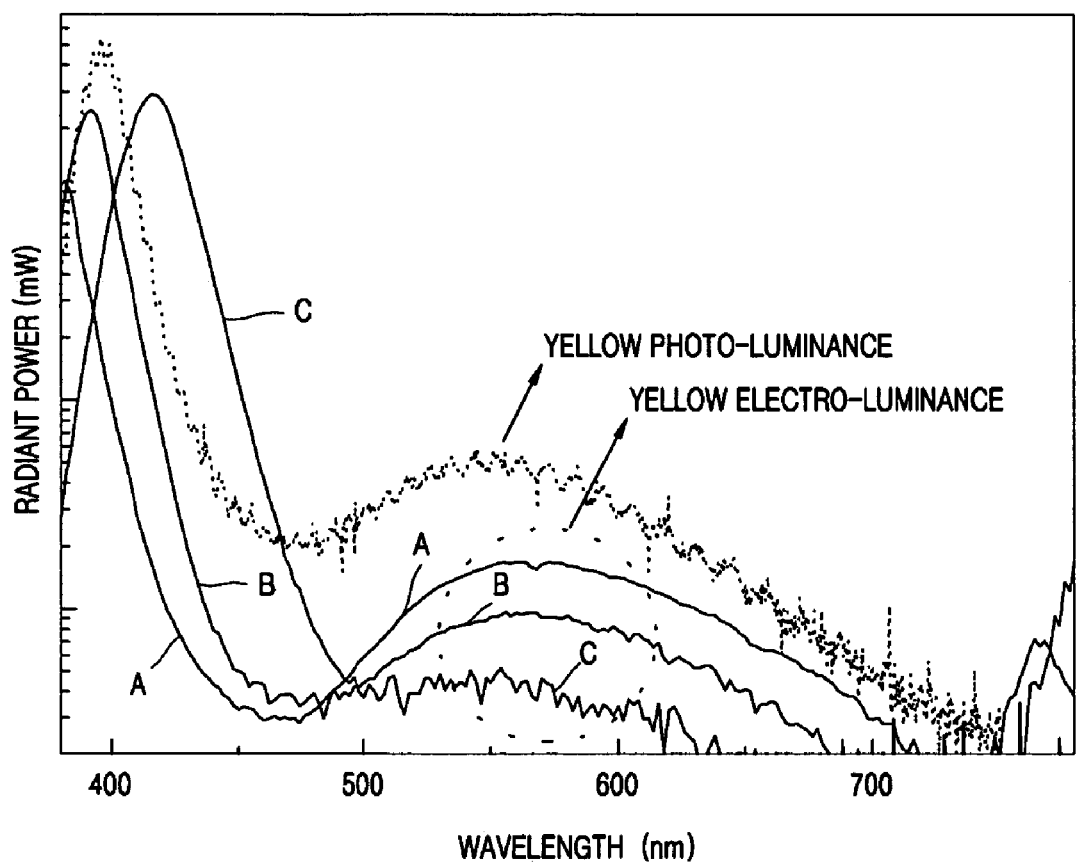
FIG. 5 is a graph showing a measured electro-luminescence (EL) spectrum and a measured photo-luminance (PL) spectrum of a light emitting device according to the present invention.

FIG. 5 is a graph showing a measured electro-luminescence (EL) spectrum and a measured photo-luminance (PL) spectrum of a light emitting device according to the present invention. FIG. 5 shows EL spectra in three samples A, B, and C, in which a GaN barrier of an MQW active layer is doped with Si at 775° C. using silane gases of 0.35 sccm, 0.3 sccm, and 0.25 sccm, respectively, and a PL spectrum in the sample B. The MQW active layer is formed by stacking GaN/AlGaN for 5 periods. The EL and PL spectra were measured when the MQW active layer was driven with a current of 20 mA.

It can be known from FIG. 5 that yellow light (YL) varies according to a concentration at which the active layer is doped with impurities. From a comparison between EL and PL wavelengths, it can be known that an origin of yellow emission (YE) is obtained not from a package but from a semiconductor itself.

Figure 6:
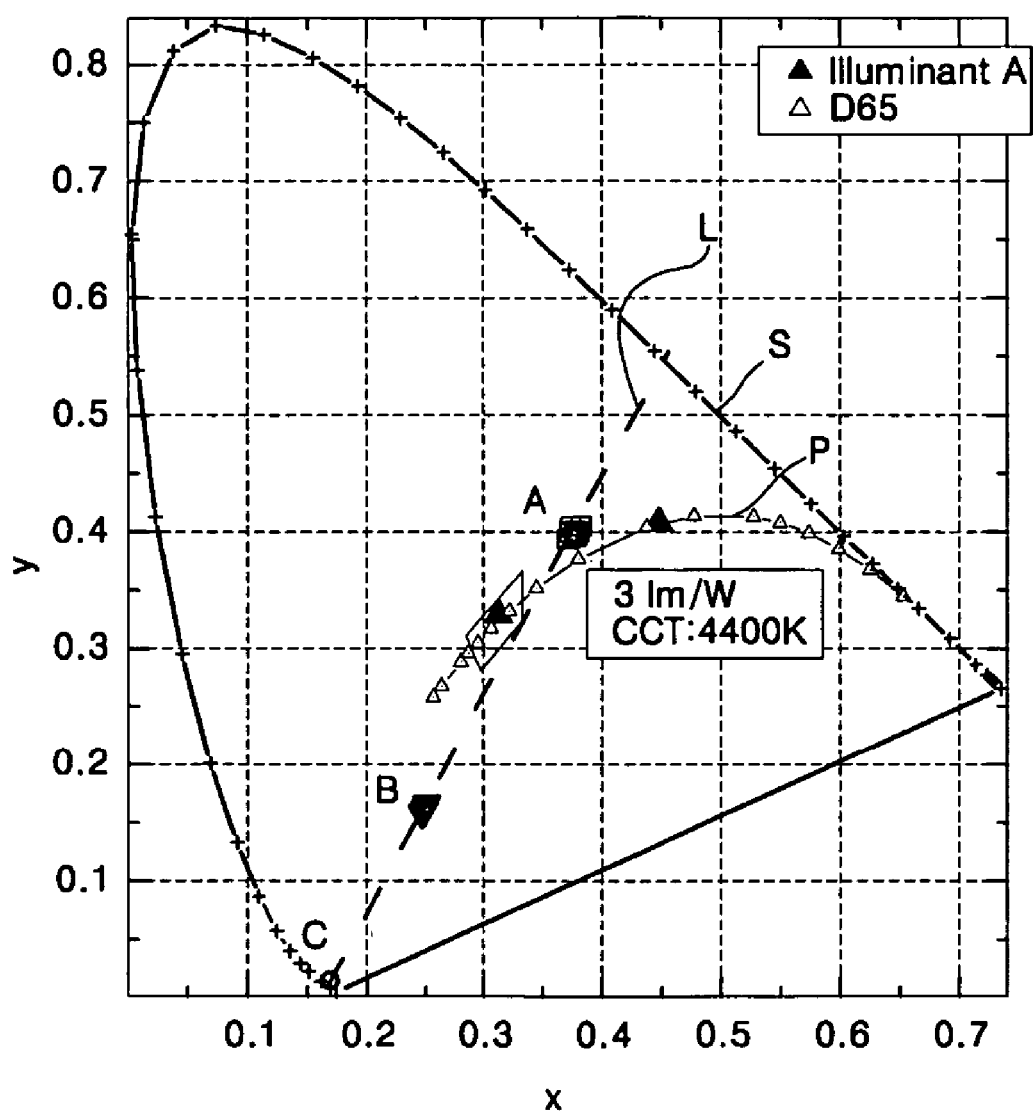
FIG. 6 is a CIE diagram showing a color coordinate of light obtained from samples A, B, and C obtained in FIG. 5.

FIG. 6 is a color coordinate showing a variation of YE of the samples A, B, and C obtained in FIG. 5. Referring to FIG. 6, an amount of YE increases in sequence of samples C, B, and then A. Alternatively, it can be known from FIG. 6 that color change is possible on a connection line (L) of a center (0.45, 0.55) of YE and a center (0, 17, 0.02) of band emission (BE). A CIE diagram includes a spectrum locus (S), forming an outline of the CIE diagram, and a plankian locus (P), existing in the CIE diagram. Considering that light having a coordinate value on the plankian locus (P) is recognized as white, a color coordinate of light emission can be changed by controlling a concentration of silicon or rare earth metal ions contained in an active layer. In FIG. 6, a coordinate of the sample A represents white light having a color temperature (CCT) of 4400K. Hence, the sample A itself is a white light emitting device and can be applied to an actual backlight device.

The present invention proposes a structure of a white light emitting device that can be used as a white light source by inducing sub-band emission due to impurities within an active layer of a nitride semiconductor. In the white light emitting device, any of a well layer and a barrier layer that constitute an active layer is doped with dopants, for example, Si or rare earth metal.

As described above, the present invention provides a monolithic white light emitting device in which white light emission occurs in a semiconductor layer. This monolithic white light emitting device can emit white light without any help of a phosphor that is needed in a conventional white light emitting device, so a manufacture of the monolithic white light emitting device becomes easier. Particularly, since the monolithic white light emitting device has a monolithic structure, it can be applied to a wide range of fields, and its manufacturing costs are low.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A white light emitting device comprising:
    an n-type nitride semiconductor layer;
    a p-type nitride semiconductor layer; and
    an active layer having at least one quantum well structure, interposed between the n-type and p-type nitride semiconductor layers,
    wherein the active layer is doped by doping atoms to form a doping level for emitting at least a first wavelength light due to sub-band emission and the active layer also simultaneously emits a second wavelength light based due to band-to-band emission.

2. The white light emitting device of claim 1, wherein the nitride semiconductor layer is GaN.

3. The white light emitting device of claim 1, wherein the active layer includes a GaN barrier layer and an InGaN well layer.

4. The white light emitting device of claim 3, wherein the well layer includes the doping atoms.

5. The white light emitting device of claim 4, wherein the doping atoms are of silicon.

6. The white light emitting device of claim 4, wherein the doping atoms are of a rare earth metal.

7. The white light emitting device of claim 1, wherein the n-type semiconductor layer is GaN doped with Si, and the p-type semiconductor layer is GaN doped with Mg.

8. A white light emitting device comprising:
    an n-type nitride semiconductor layer;
    a p-type nitride semiconductor layer;

first and second active layers each having at least a quantum well, interposed between the n-type and p-type nitride semiconductor layers; and a nitride cladding layer installed between the first and second active layers, wherein the first active layer is at least partially doped by doping atoms to form a doping level for emitting a first wavelength light based on sub-band emission and the second active layer is un-doped to emit a second wavelength light based on band-to-band emission.

9. The white light emitting device of claim 8, wherein the n-type and p-type nitride semiconductor layers are GaN.

10. The white light emitting device of claim 8, wherein each of the first and second active layers includes a GaN barrier layer and an InGaN well layer.

11. The white light emitting device of claim 10, wherein the well layer includes the doping atoms.

12. The white light emitting device of claim 11, wherein the doping atoms are of silicon.

13. The white light emitting device of claim 11, wherein the doping atoms are of a rare earth metal.

14. The white light emitting device of claim 8, wherein the n-type semiconductor layer is GaN doped with Si, and the p-type semiconductor layer is GaN doped with Mg.

15. The white light emitting device of claim 1, wherein the active layer includes a barrier layer that includes doping atoms.

* * * * *